United States Patent
Cesare Callegari et al.

(10) Patent No.: US 6,632,483 B1
(45) Date of Patent: *Oct. 14, 2003

(54) ION GUN DEPOSITION AND ALIGNMENT FOR LIQUID-CRYSTAL APPLICATIONS

(75) Inventors: Alessandro Cesare Callegari, Yorktown Heights, NY (US); Praveen Chaudhari, Briarcliff Manor, NY (US); James Patrick Doyle, Bronx, NY (US); Eileen Ann Galligan, Fishkill, NY (US); Yoshimine Kato, Kanagawa (JP); James Andrew Lacey, Mahopac, NY (US); Shui-Chih Alan Lien, Briarcliff Manor, NY (US); Minhua Lu, Mohegan Lake, NY (US); Hiroki Nakano, Shiga (JP); Shuichi Odahara, Kanagawa-Ken (JP)

(73) Assignee: International Business Machines Corporation, Armonk, NY (US)

( * ) Notice: Subject to any disclaimer, the term of this patent is extended or adjusted under 35 U.S.C. 154(b) by 14 days.

This patent is subject to a terminal disclaimer.

(21) Appl. No.: 09/608,798

(22) Filed: Jun. 30, 2000

(51) Int. Cl.⁷ .................. C23C 14/48; C23C 14/34; C23C 14/24; C23C 16/26; B05D 5/00
(52) U.S. Cl. .................. 427/526; 427/525; 427/530; 427/577; 427/562; 204/192.15
(58) Field of Search ............... 427/523, 525, 427/526, 530, 577, 562; 204/192.15, 192.16, 192.26, 192.29; 117/92, 103, 108

(56) References Cited

U.S. PATENT DOCUMENTS

| | | | |
|---|---|---|---|
| 4,153,529 A | * | 5/1979 | Little et al. ............. 204/192 |
| 4,261,650 A | * | 4/1981 | Sprokel |
| 4,800,100 A | * | 1/1989 | Herbots et al. |
| 4,844,785 A | * | 7/1989 | Kitabatake et al. ..... 204/192.11 |
| 5,134,301 A | * | 7/1992 | Kamata et al. .......... 250/492.2 |
| 5,601,654 A | * | 2/1997 | Springer ............... 118/723 HC |
| 5,650,378 A | * | 7/1997 | Iijima et al. ........... 204/192.11 |
| 5,770,826 A | | 6/1998 | Chaudhari et al. ..... 204/157.15 |
| 6,020,946 A | * | 2/2000 | Callegari et al. ........... 349/124 |
| 6,061,114 A | * | 5/2000 | Callegari et al. ........... 349/125 |
| 6,444,100 B1 | * | 9/2002 | McLeod ................ 204/192.16 |
| 2001/0043300 A1 | * | 11/2001 | Nakano ....................... 349/129 |
| 2002/0001057 A1 | * | 1/2002 | Chaudhari et al. .......... 349/124 |
| 2002/0048638 A1 | * | 4/2002 | Gruen et al. ................. 427/577 |
| 2002/0063055 A1 | * | 5/2002 | Katoh et al. ................ 427/523 |
| 2003/0019668 A1 | * | 1/2003 | Reude et al. ................ 117/103 |

OTHER PUBLICATIONS

"Diamond Thin Films", *Chemical & Engineering News*, excerpt p. 32–33, May 15, 1989.*

"Method for Controlling Crystal Orientation in Thin Films"; *IBM Technical Disclosure Bulletin*, vol. 25; Issue #7A, p. 3331–3333, Dec. 1982.*

* cited by examiner

*Primary Examiner*—Marianne Padgett
(74) *Attorney, Agent, or Firm*—Ohlandt, Greeley, Ruggiero & Perle, L.L.P.; Robert M. Trepp

(57) ABSTRACT

The present invention includes a method of forming an aligned film on a substrate. The film is deposited and aligned in a single step by a method comprising the step of bombarding a substrate with an ion beam at a designated incident angle to simultaneously (a) deposit the film onto the substrate and (b) arrange an atomic structure of the film in at least one predetermined aligned direction.

16 Claims, 5 Drawing Sheets

ION GUN DEPOSITION AND ALIGNMENT FOR LIQUID-CRYSTAL APPLICATIONS

BACKGROUND OF THE INVENTION

1. Field of the Invention

The present invention relates to a method of forming a transparent film having an aligned atomic structure. More particularly, the present invention relates to a method of forming an aligned transparent film that is deposited and aligned in a single step.

2. Description of the Prior Art

The alignment of liquid crystal molecules on a surface is one of the critical steps in the manufacturing of a liquid crystal display. The industry-wide method for producing such alignment is through the mechanical rubbing of a polyimide surface. This method requires a physical contact between a roller or brush and the polyimide surface. The rubbing process realigns the surface of the polyimide, which then acts as an alignment template for the orientation of the liquid crystal molecules in the preferred direction.

This approach has several disadvantages. For example, because the rubbing method is a contact technique, debris can be generated during the rubbing process resulting in a low process yield. Moreover, additional cleaning steps are generally required to remove the debris. Also, as the roller or brush rubs the surface of the display, electrostatic charges can build up which may discharge through the thin film transistors (TFT) resulting in a lowering of the process yield. Additionally, the rubbing process requires a relatively soft layer in order to modify the surface in a desired orientation. Thus, choice of materials that are suitable for use in the rubbing process is limited.

U.S. Pat. No. 5,770,826 to Chaudhari et al. describes the use of low energy ion beams to align surfaces for liquid crystal applications. In these cases, the alignment was performed on an alignment layer deposited by a distinct and separate process. While a wide variety of surfaces were found to be suitable for alignment by an ion beam technique, the reference does not teach the deposition of the alignment layer and the alignment of the layer in a single step.

One of the main driving forces in the liquid crystal industry is the constant reduction in the cost of production. In both the alignment of a polyimide layer via mechanical rubbing/brushing or the alignment of layers using ion beams as described in the previously incorporated U.S. Pat. No. 5,770,826, the alignment layer must be applied prior to the alignment procedure. Consequently, the deposition of an alignment layer and subsequent alignment of the alignment layer in separate process steps introduces additional costs into the manufacturing process. The applicants have found that deposition and alignment of such a layer can be accomplished in a single step, which significantly reduces the manufacturing cost.

SUMMARY OF THE INVENTION

The present invention includes a method of forming a film on a substrate, wherein said film exhibits an aligned atomic structure. The method comprises the step of bombarding said substrate with at least one ion beam from at least one ion beam source at a designated incident angle to simultaneously (a) deposit said film onto said substrate, and (b) arrange said atomic structure of said film in at least one predetermined aligned direction.

The method according to the present invention is a dry deposition and alignment technique, which reduces the need for pre- and post-wet processing. The present method is also a non-contact deposition and alignment technique, which reduces any potential contamination of the surface by extraneous debris, such as those commonly encountered in the contact rubbing techniques of the prior art.

Accordingly, the present invention provides a simple and cost effective method of forming easily processed aligned films on which liquid crystals can be aligned for use in wide viewing angle liquid-crystal displays.

DETAILED DESCRIPTION OF THE INVENTION

The present invention relates to a method of forming an aligned film on a substrate in a single step by combining the deposition and alignment of an alignment layer into a single-step using ion beam processing.

The term "aligned film" refers to a film in which the atomic or molecular structure of the film, or the atomic or molecular surface structure thereof, has a predetermined direction or orientation. According to the present invention, an alignment film is deposited and the atomic or molecular structure of the alignment film is aliged in at least one desired direction through use of an ion beam.

Figure 1:
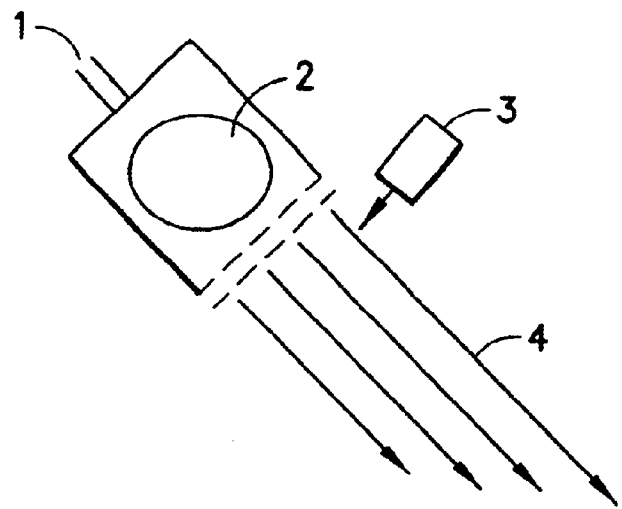
FIG. 1 is a schematic of an ion beam source.

Referring to FIG. 1, an ion beam source is shown. Through gas inlet 1 a carbon-containing gas, preferably a hydrocarbon gas, such as methane, is introduced into the plasma chamber 2, i.e., discharge chamber of an ion beam source.

The carbon-containing gas optionally can be mixed with an inert gas, such as, argon or nitrogen such that argon and/or nitrogen can be introduced along with the hydrocarbon gas into the discharge chamber. The gas is ionized in the discharge chamber to produce an ion beam 4 comprising atoms and ions, which are then accelerated out of the ion source through the application of accelerating voltages. Sufficient voltage is applied to the ion beam 4 to accelerate the atoms and ions out of the ion beam source.

An electron source 3 for beam neutralization is disposed, for example, in close proximity along the path of the ion beam 4 to neutralize the ion beam. Neutralization can also be accomplished with a tungsten or tantalum wire strung across the ion beam source. Upon electron neutralization of the beam using electron source 3, the ion beam can further comprise neutral molecules in addition to ions and atoms.

The energy of the impinging species is kept below a level such that a net accumulation, i.e., net deposition, is recorded on the substrate surface. The energy of the depositing species must be below the energy required to permit deposition of an alignment layer on the substrate. If this condition is not satisfied, then the result will be a net etch, or at the very least, no net deposition.

In these experiments, ion beam energies below 500 eV were used. Preferably, the ion beam has an energy from about 100 to 500 eV. However, higher energies are also possible as long as they satisfy the constraints discussed above.

The deposition rate is a function of the sticking coefficient of the deposited species as well as the number of incident atoms at the substrate surface as a function of time. The deposition rate of the film can be controlled by varying the ion current density, the time of exposure of the surface to the ion beam, or both.

The angle of incidence of the depositing energetic species, i.e., the designated incident angle for bombardment, also controls the alignment properties of the deposited film.

Figure 2:
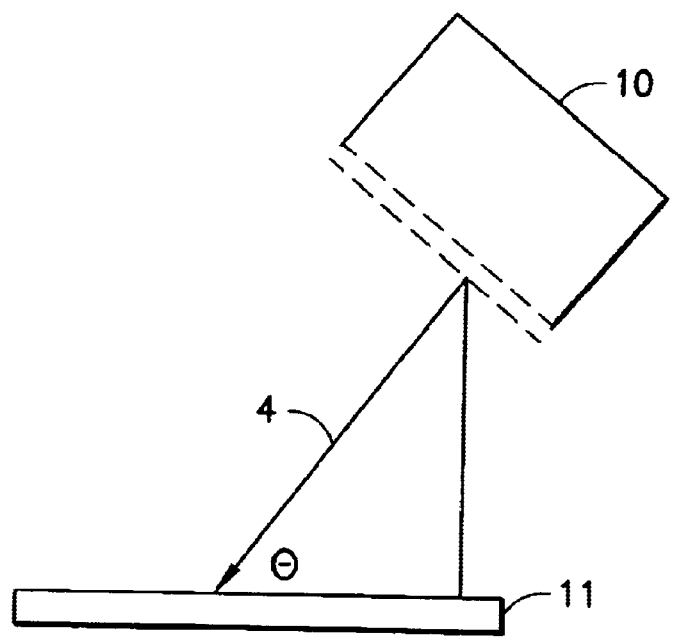
FIG. 2 depicts the geometry of the ion source relative to the substrate, wherein θ (theta) is the angle of incidence.

Referring to FIG. 2, the geometry of the ion source relative to the substrate 11 is depicted, herein θ (theta) is the angle of incidence, which is the designated incident angle for bombardment by ion beam 4. Preferably, the angle of incidence is from about 10 to about 70 degrees. More preferably, the angle of incidence is from about 25 to about 60 degrees.

Figure 3:
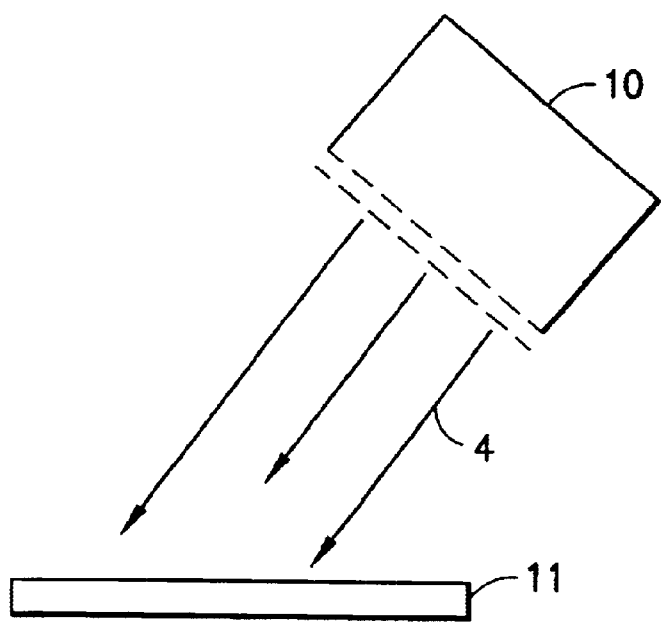
FIG. 3 is a schematic of an embodiment with a fixed substrate.
Figure 4:
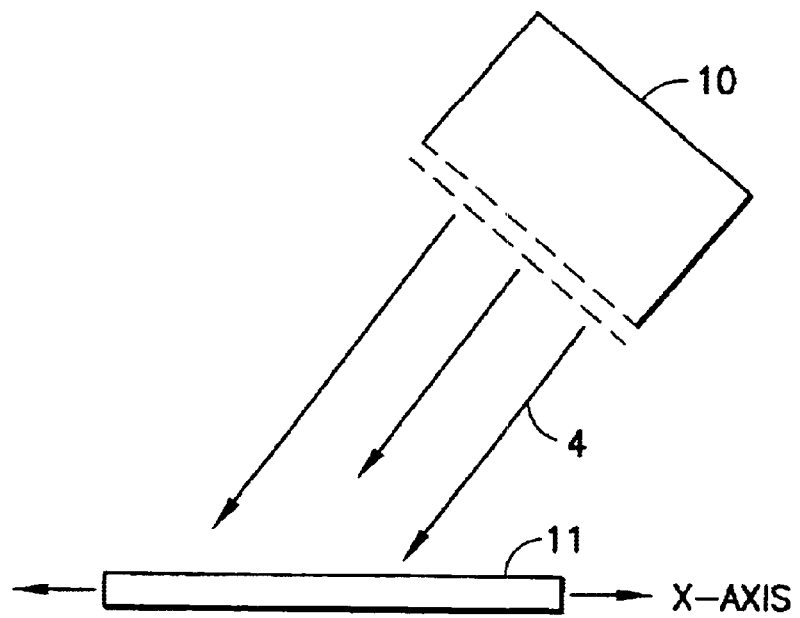
FIG. 4 is a schematic of an embodiment with a moving substrate.

Deposition and alignment can be accomplished in either a static or dynamic mode of operation. As shown in FIG. 3, substrate 11 can be held fixed relative to the ion source 10 generating the ion beam 4 during the process. Alternatively, as shown in FIG. 4, substrate 11 can be moved relative to the ion source 10 in a direction shown by arrows along the x-axis such that substrate 11 is bombarded by the ion beam during the process. Both of these embodiments result in the deposition of an alignment layer for liquid crystal display applications.

Figure 5:
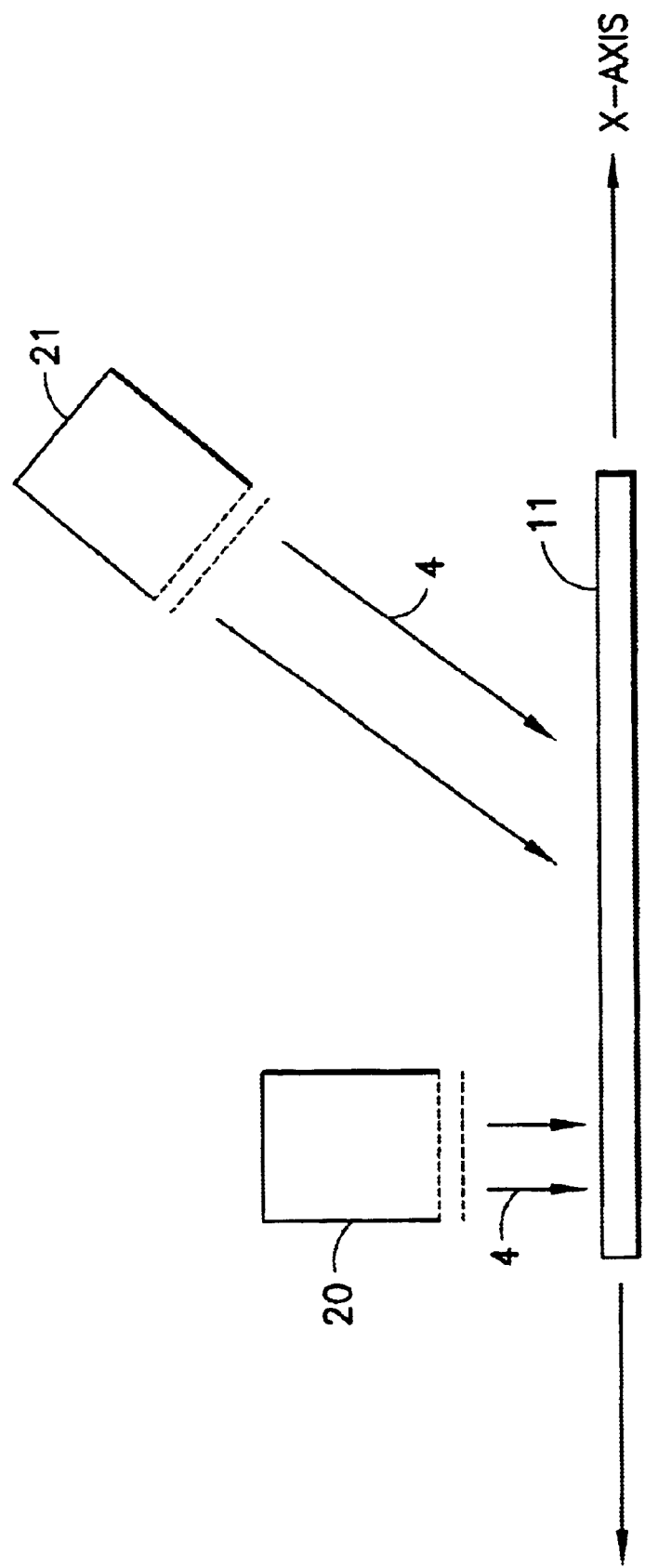
FIG. 5 is a schematic of an embodiment in which an aligned film on a moving substrate is obtained using two ion sources.

FIG. 5 shows an embodiment in which an aligned film on a moving substrate is obtained using more than one source, i.e., two ion sources.

In this embodiment, two ion guns are used to produce an alignment layer. The first ion source, i.e., a deposition ion gun 20, preferably has a perpendicular or close to perpendicular orientation with respect to the substrate 11. The second ion source, i.e., an alignment ion gun 21, is oriented such that the ion beam forms an angle θ (theta) with the substrate, as shown in FIG. 5. Preferably, the designated incident angle in the first ion beam is diferent from designated incident angle of said second ion beam. Typically, the angle between the substrate and the second ion source is from about 25 to about 60 degrees. An angle of about 35 degrees is advantageously used to align the films.

In general, substrate 11 is moved relative to the ion sources 20 and 21 in a direction shown by arrows along the x-axis such that substrate 11 is bombarded by the ion beam during the process. However, depending on the movement of the substrate or the ion beam source, the designated incident angle used to both deposit and to align may vary over time.

Other typical but non-limiting parameters are listed below:

DEPOSITION GUN:

| Gas Flow: | CH$_4$: 6 sccm |

-continued

| | |
|---|---|
| | Ar: 3 sccm |
| Operating Pressure: | 5 × 10$^{-2}$ Pa |
| Beam Energy: | 300 eV |
| Beam Current: | 50 mA |
| ALIGNMENT GUN: | |
| Gas Flows: | Ar: 14 sccm |
| Operating Pressure: | 5 × 10$^{-2}$ Pa |
| Beam Energy: | 200 eV |
| Beam Current: | 100 mA |

Figure 6:
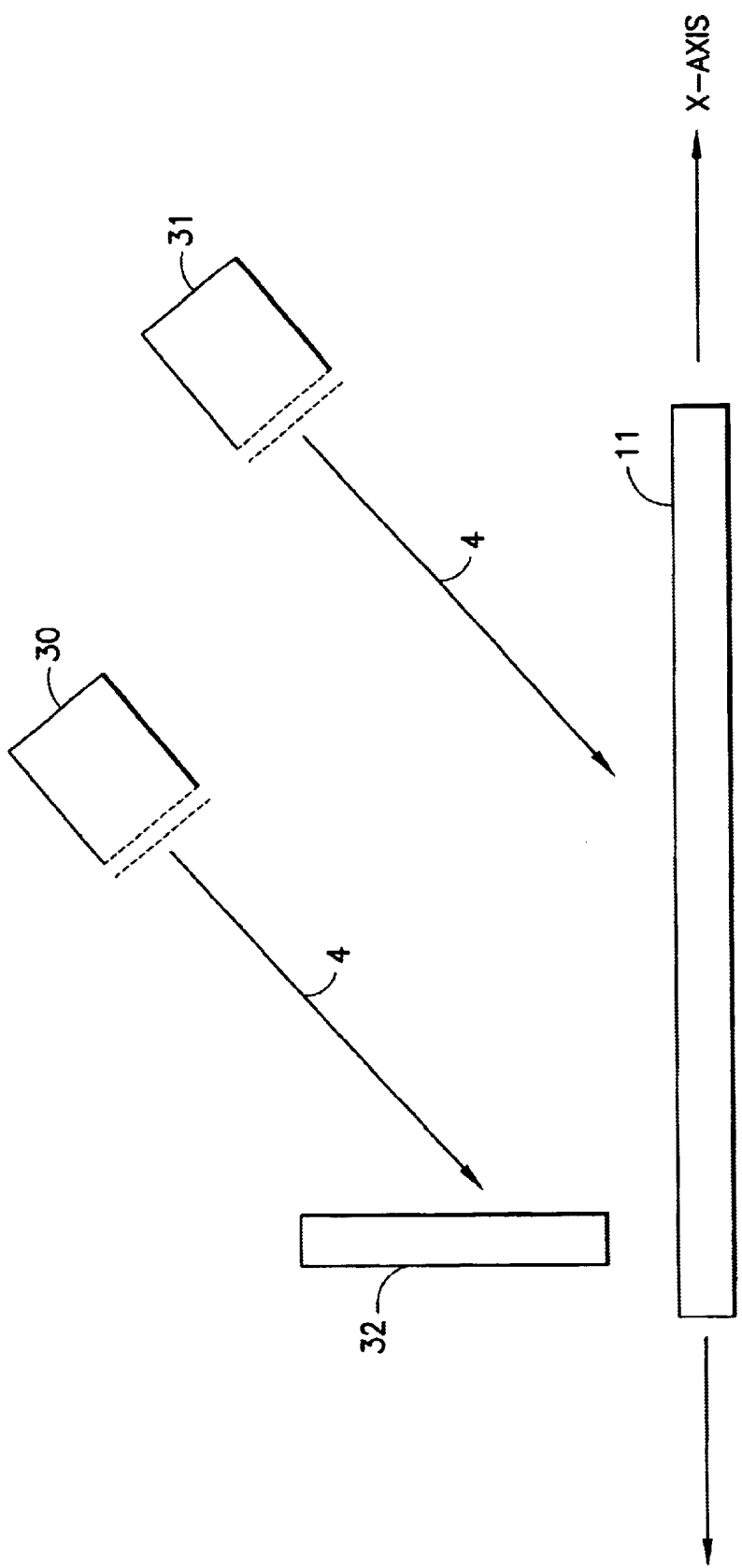
FIG. 6 is a schematic of an embodiment employing two ion guns in which an aligned film on a moving substrate is obtained by a combination of sputter deposition and direct alignment.

FIG. 6 shows an embodiment employing two ion guns which an aligned film on a moving substrate is obtained by a combination of sputter deposition and direct alignment.

Sputter ion gun 30 is directed at a sputter material target 32, which is then bombarded with atoms and ions from the sputter ion gun resulting in a transfer of material from the target to the substrate.

The target can be, but is not limited to, carbon. It is highly desireable that the film is optically transparent in the visible spectrum. Accordingly, a diamond-like carbon film is preferred.

Preferably, the angle between the target and the substrate is from 30 to 60 degrees. The operating parameters of the alignment gun are similar to those described above. The alignment gun 31 provides desired alignment and imparts desired texture to the film. Substrate 11 can be moved relative to the sputter material target 32 and ion source 31 in a direction shown by arrows along the x-axis such that substrate 11 is bombarded by the sputter beam and the ion beam during the process.

Figure 7:
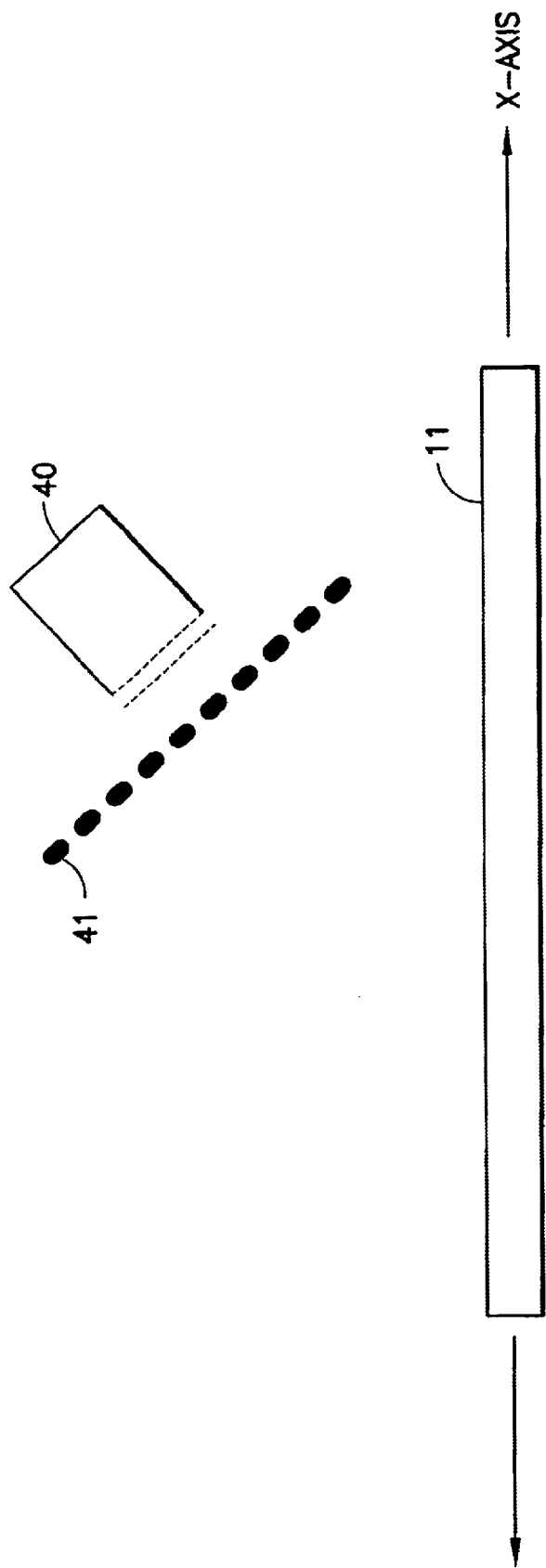
FIG. 7 illustrates an embodiment with a single ion source in which an aligned film on a moving substrate is obtained using a collimnator.

FIG. 7 illustrates an embodiment with a single ion source 40 in which an aligned film on substrate 11 is obtained using collimnator 41, i.e., a "bee's nest collimnator," preferably constructed of carbon. As above, substrate 11 moves relative to the ion beam source over time in a direction shown by arrows along the x-axis during the deposition and alignment.

In this embodiment, collimnator 41 is placed in the path of the incident ion beam, which comprises ions and atoms. A portion of the incident energetic species will sputter the collimnator in a forward direction, which will result in a net deposition of a film on a surface of substrate 11 and, simultaneously, the ion beam comprising ions and atoms that passes through the collimnator will align the deposited layer in the same step.

A liquid cell fabricated using a film deposited and aligned with an ion source by the method of the present invention as the alignment layer displayed excellent contrast. The following parameters were used for the deposition and alignment:

| Gas Flows: | CH4: 10 sccm |
|---|---|
| | Ar: 1.5 sccm |
| Operating Pressure: | 5 × 10$^{-2}$ Pa |
| Beam Energy: | 200 eV |
| Beam Current: | 100 mA |

The measured pre-tilt angle in this case was 4 degrees which is well within the range required for fabricated into display cells.

In addition, applicants have found that when fabricated into display cells, the alignment layers prepared according to the present invention have sufficient anchoring energies.

Anchoring energy is defined as the energy, which describes how good the liquid crystal directors are aligned to the alignment direction of the alignment layer. The alignment direction in the present case is the projection of the ion beam traveling direction on the alignment layer surface. The higher the anchoring energy, the closer the liquid crystal directors are aligned to the alignment direction.

For most liquid crystal displays, a high anchoring energy is necessary to obtain good optical performance. The rubbed polyimide films used in current liquid crystal displays usually give an anchoring energy of $1.0 \times 10^{-3}$ N/m or higher, which is considered to be strong anchoring. In contrast, non-contact alignment methods usually give an anchoring energy less than that of rubbed polyimide. The alignment layers prepared according to the present invention unexpectedly produce an anchoring energy of $1.0 \times 10^{-3}$ N/m or higher. This demonstrates that alignment layers provided by the method of present invention are at least as good as rubbed polyimide.

The present invention provides a simple and cost effective method of forming easily processed aligned films on which liquid crystals can be aligned to form flat panels suitable for use as wide viewing angle liquid-crystal displays.

Although discussed in the context using the output of ion beam source, in some embodiments a direct writing technique can be used to direct the ion beam to desired regions to form a film having an aligned atomic structure.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A method of forming an amorphous film on a substrate, wherein said amorphous film exhibits an aligned atomic structure, said method comprising the step of:
   bombarding said substrate with at least one ion beam from at least one ion beam source at a designated incident angle to simultaneously (a) deposit said amorphous film onto said substrate, and (b) arrange said atomic structure of said amorphous film in at least one predetermined aligned direction, wherein said ion beam has an energy from about 100 to 300 eV and said designated incident angle is from about 25 to about 60 degrees and wherein said amorphous film is a diamond-like carbon film.

2. The method of claim 1, wherein said designated incident angle produces a net deposition on a surface of said substrate.

3. The method of claim 1, wherein said ion beam comprises impinging species and wherein the energy of said impinging species is kept below the energy required for etching said amorphous film on a surface of said substrate.

4. The method of claim 1, wherein said ion beam is generated by a process comprising the steps of:
   introducing a carbon-containing gas into a discharge chamber of a source of said ion beam;
   ionizing said carbon-containing gas in said discharge chamber to produce said ion beam comprising ions; and
   applying sufficient voltage to said ion beam to accelerate said ions out of said ion beam source.

5. The method of claim 4, wherein said ion beam has an energy from about 200 to 300 eV.

6. The method of claim 1, wherein said ion beam is generated using an ion gun.

7. The method of claim 1, wherein said ion beam further comprises neutral molecules.

8. The method of claim 1, wherein said bombarding is carried out simultaneously using a first ion beam and a second ion beam.

9. The method of claim 8, wherein said designated incident angle in said first ion beam is different from the designated incident angle of said second ion beam.

10. The method of claim 1, wherein said designated incident angle varies over time.

11. The method of claim 1, wherein said amorphous film is optically transparent in the visible spectrum.

12. The method of claim 1, further comprising the step of:
   placing a collimnator in the path of said ion beam between said substrate and said ion beam source at a designated incident angle to sputter material of said collimnator onto said substrate.

13. The method of claim 1, further comprising the step of:
   moving said substrate or said ion beam source relative to the other over time.

14. A method of forming an amorphous film on a substrate, wherein said amorphous film exhibits an aligned atomic structure, said method comprising the step of:
   bombarding a collimnator placed in the path of an ion beam from an ion beam source between said substrate and said ion beam source at a designated incident angle to sputter material of said collimnator onto said substrate and to simultaneously (a) deposit said amorphous film onto said substrate and (b) arrange said atomic structure of said amorphous film in at least one predetermined aligned direction wherein said ion beam has an energy from about 100 to 300 eV and said designated incident angle is from about 25 to about 60 degrees and wherein said amorphous film is a diamond-like carbon film.

15. The method of claim 14, wherein said collimnator is formed of a carbon material.

16. A method of forming an amorphous film on a substrate, wherein said amorphous film exhibits an aligned atomic structure, said method comprising the steps of:
   introducing a carbon-containing gas into a discharge chamber of an ion beam source;
   ionizing said carbon-containing gas in said discharge chamber to produce an ion beam comprising ions;
   applying sufficient voltage to said ion beam to accelerate said ions out of said ion beam source; and
   bombarding said substrate with at least one ion beam from at least one ion beam source at a designated incident angle to simultaneously (a) deposit said amorphous film onto said substrate, and (b) arrange said atomic structure of said amorphous film in at least one predetermined aligned direction, wherein said ion beam has an energy from about 100 to 300 eV and said designated incident angle is from about 25 to about 60 degrees and wherein said amorphous film is a diamond-like carbon film.

* * * * *